(12) United States Patent
Zhang

(10) Patent No.: US 9,130,510 B2
(45) Date of Patent: Sep. 8, 2015

(54) HIGH-FREQUENCY BANDWIDTH AMPLIFYING CIRCUIT

(71) Applicant: IPGoal Microelectronics (Sichuan) Co., Ltd., Chengdu, Sichuan (CN)

(72) Inventor: Ziche Zhang, Sichuan (CN)

(73) Assignee: IPGoal Microelectronics (Sichuan) Co., Ltd., Chengdu, Sichuan Province (CN)

( * ) Notice: Subject to any disclaimer, the term of this patent is extended or adjusted under 35 U.S.C. 154(b) by 55 days.

(21) Appl. No.: 14/062,756

(22) Filed: Oct. 24, 2013

(65) Prior Publication Data

US 2014/0176241 A1    Jun. 26, 2014

(30) Foreign Application Priority Data

Oct. 24, 2012    (CN) .......................... 2012 1 0410497

(51) Int. Cl.
*H03F 3/26* (2006.01)
*H03F 3/195* (2006.01)
*H03F 3/30* (2006.01)

(52) U.S. Cl.
CPC .............. *H03F 3/195* (2013.01); *H03F 3/3016* (2013.01); *H03F 2200/294* (2013.01); *H03F 2203/30031* (2013.01)

(58) Field of Classification Search
CPC .......................................................... H03F 3/26
USPC ....................... 330/265, 267, 311, 251, 207 A
See application file for complete search history.

(56) References Cited

U.S. PATENT DOCUMENTS

| 2,100,948 | A | * | 11/1937 | Doll | 473/556 |
| 3,437,944 | A | * | 4/1969 | Camenzind | 330/291 |
| 4,021,684 | A | * | 5/1977 | Macey | 327/108 |
| 5,418,495 | A | * | 5/1995 | Harvey | 330/265 |
| 5,467,058 | A | * | 11/1995 | Fujita | 330/267 |
| 6,646,508 | B1 | * | 11/2003 | Barbetta | 330/264 |
| 7,432,764 | B2 | * | 10/2008 | Oppelt | 330/265 |

* cited by examiner

*Primary Examiner* — Henry Choe

(57) ABSTRACT

A high-frequency bandwidth amplifier circuit comprises: a push-pull amplifier, a feedback resistor, a first active inductor, and a second active inductor. An input terminal of the push-pull amplifier is connected with an external input terminal. An output terminal of the push-pull amplifier is connected with an output port. A first end of the feedback resistor is connected with the external input terminal. A second end of the feedback resistor is connected with the output port. A first end of the first active inductor is connected with an external power source. A second end of the first active inductor is connected with the output port. A first end of the second active inductor is grounded. A second end of the second active inductor is connected with the output port.

3 Claims, 1 Drawing Sheet

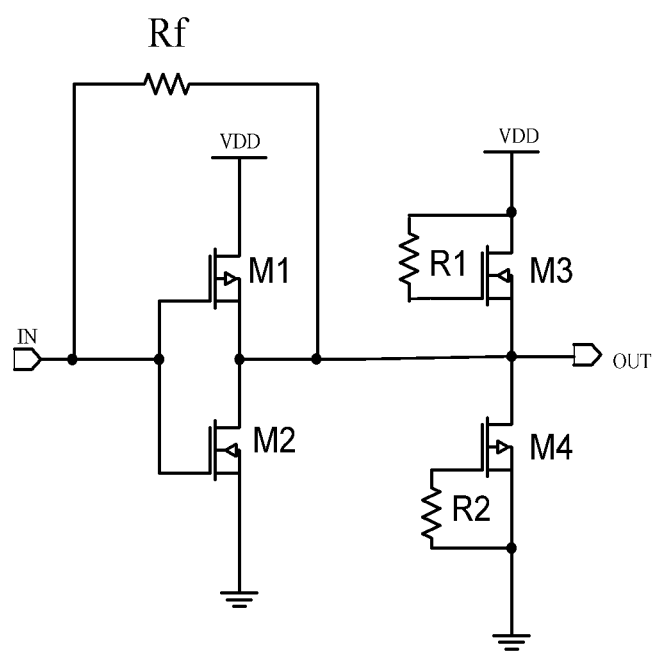

HIGH-FREQUENCY BANDWIDTH AMPLIFYING CIRCUIT

BACKGROUND OF THE PRESENT INVENTION

1. Field of Invention

The present invention relates to the field of integrated circuit (IC), and more particularly to a high-frequency bandwidth amplifier circuit.

2. Description of Related Arts

In different kinds of signal receivers (RF communications, optical communications, high-speed serial communications), the weak signals received are required to be further amplified, in order to facilitate processing the weak signal by the follow-up circuit. Along with the higher and higher signal frequency, the loss of signal is also growing in the process of transmission media. It is well known that the higher signal frequency requires the wider bandwidth of the amplified circuit, and the higher loss of signal requires the higher gain of the amplified circuit. The combination of these two aspects demands for amplifiers of higher and higher gain bandwidth product.

In the conventional high-frequency bandwidth amplifier circuit, basing on conventional structure that is topological invariant, in order to acquire higher gain bandwidth product, higher current and power loss is required. However, the gain bandwidth product is directly proportional to the square working current. This method demands to provide larger current, and also demands for larger power loss, which makes this method more and more unattractive. In addition, a small-sized amplifier can be used, to reduce the parasitic capacitance of the amplifier, for declining the influence on the bandwidth. However, the current driving capability of the small-sized amplifier is also very weak, and thus the amplifier cannot satisfy working requirement. Along with the further increased demand of the gain bandwidth product by the high-frequency bandwidth amplifier circuit, because of the limit of conventional topology, even if the current is further increased, the gain bandwidth product cannot be increased effectively. Thus, the improvement of the gain bandwidth product by the high-frequency bandwidth amplifier circuit falls into technological bottlenecks.

Therefore, it is necessary to provide a modified high-frequency bandwidth amplifier circuit to cover flaws which have been mentioned above.

SUMMARY OF THE PRESENT INVENTION

An object of the present invention is to provide a high-frequency bandwidth amplifier circuit. The high-frequency bandwidth amplifier circuit possesses a higher gain bandwidth product and lower power loss. A structure of a push-pull amplifier of the high-frequency bandwidth amplifier circuit is simple. A parasitic capacitance of the push-pull amplifier is small. And a noise is low.

In order to accomplish the above objects, the present invention provides a high-frequency bandwidth amplifier circuit, comprising:
 a push-pull amplifier,
 a feedback resistor,
 a first active inductor, and
 a second active inductor,
 wherein an input terminal of the push-pull amplifier is connected with an external input terminal. An output terminal of the push-pull amplifier is connected with an output port. A first end of the feedback resistor is connected with the external input terminal. A second end of the feedback resistor is connected with the output port. A first end of the first active inductor is connected with an external power source. A second end of the first active inductor is connected with the output port. A first end of the second active inductor is grounded. A second end of the second active inductor is connected with the output port.

Preferably, the push-pull amplifier comprises a first FET (field-effect tube) and a second FET. A gate electrode of the first FET and a gate electrode of the second FET are both connected with the external input terminal. A source electrode of the first FET is connected with the external power source. A source electrode of the second FET is grounded. A drain electrode of the first FET and a drain electrode of the second FET are both connected with the output port.

Preferably, the first active inductor comprises a first resistor and a third FET. A drain electrode of the third FET is connected with the external power source. A source electrode of the third FET is connected with the output port. A first end of the first resistor is connected with a gate electrode of the third FET. A second end of the first resistor is connected with the drain electrode of the third FET.

Preferably, the second active inductor comprises a second resistor and a fourth FET. A drain electrode of the fourth FET is connected with the output port. A source electrode of the fourth FET is grounded. A first end of the second resistor is connected with a gate electrode of the fourth FET. A second end of the second resistor is connected with the source electrode of the fourth FET.

Compared with the conventional technology, in the high-frequency bandwidth amplifier circuit of the present invention, because the output terminal of the push-pull amplifier is connected with the first active inductor and the second active inductor, the first end of the first active inductor is connected with the external power source, the first end of the second active inductor is grounded, so that the cooperation between the first inductor and the second inductor provides an extra zero that is able to offset a pole of the output terminal of the push-pull amplifier, to expend a bandwidth of an output signal, and to improve a gain bandwidth product of the output signal. The cooperation between the first active inductor and the second inductor makes "output-power source" and "output-ground" of the high-frequency bandwidth amplifier circuit appear in pairs, so an output working point of the push-pull amplifier is determined, a floating problem of the output working point of the push-pull amplifier is avoided, and a more balanced output driving is provided.

Through the following descriptions and combined with drawings, the present invention will be more legible. Drawings are used to explain a preferred embodiment of the present invention.

These and other objectives, features, and advantages of the present invention will become apparent from the following detailed description, the accompanying drawings, and the appended claims.

BRIEF DESCRIPTION OF THE DRAWINGS

The FIGURE is a schematic diagram of a high-frequency bandwidth amplifier circuit according to a preferred embodiment of the present invention.

DETAILED DESCRIPTION OF THE PREFERRED EMBODIMENT

Referring to the FIGURE, according to a preferred embodiment of the present invention is illustrated, wherein each element is represented by a corresponding designator. As mentioned above, the present invention provides a high-frequency bandwidth amplifier circuit. The high-frequency bandwidth amplifier circuit possesses a higher gain bandwidth product and lower power loss. A structure of a main operational amplifier of the high-frequency bandwidth amplifier circuit is simple. A parasitic capacitance is small. And a noise is low.

Referring to the FIGURE, the present invention provides a high-frequency bandwidth amplifier circuit, comprising:
a push-pull amplifier,
a feedback resistor Rf,
a first active inductor, and
a second active inductor,
wherein an input terminal of the push-pull amplifier is connected with an external input terminal IN. An output terminal of the push-pull amplifier is connected with an output port OUT. The push-pull amplifier amplifies a high-frequency signal that is input by the external input terminal IN, so a gain and a bandwidth of an output signal which is high-frequency are both amplified. A first end of the feedback resistor Rf is connected with the external input terminal IN. A second end of the feedback resistor Rf is connected with the output port OUT. The feedback resistor Rf provides a negative feedback to the push-pull amplifier, for further increasing the gain and the bandwidth of the output signal of the push-pull amplifier. A first end of the first active inductor is connected with an external power source VDD. A second end of the first active inductor is connected with the output port OUT. A first end of the second active inductor is grounded. A second end of the second active inductor is connected with the output port OUT. A parasitic capacitance of the push-pull amplifier has effect on the bandwidth of the output signal amplified. However, the effect can be offset by the cooperation between the first active inductor and the second active inductor.

Specifically, the push-pull amplifier comprises a first FET M1 and a second FET M2. The external input terminal IN is connected with a gate electrode of the first FET M1 and a gate electrode of the second FET M2. A source electrode of the first FET M1 is connected with the external power source VDD. A source electrode of the second FET M2 is grounded. The output port OUT is connected with a drain electrode of the first FET M1 and a drain electrode of the second FET M2. Thus, the external input terminal IN inputs the high-frequency signal that is amplified by the push-pull amplifier. The output signal which is high-frequency is output by the output port OUT. In the process that the push-pull amplifier amplifies the high-frequency signal that is input by the external input terminal IN, because of an existence of a parasitic capacitance of the first FET M1 and the second FET M2, a pole is introduced by the high-frequency signal in a transmission path. A transfer function of the high-frequency signal is reduced in 20 db/10 time's frequency course in the pole, so a bandwidth of the transfer function of the high-frequency signal is reduced. Understandably, an amplifier (that is, the push-pull amplifier) only has an amplification effect to the high-frequency signal that is within the bandwidth. The bandwidth is lower, and the amplification effect of the amplifier is weaker to the high-frequency signal. Therefore, the parasitic capacitance of the push-pull amplifier weakens the bandwidth of the output signal that is output by the output port OUT in some extent. The feedback resistor Rf is connected between the input terminal and the output terminal of the push-pull amplifier. The feedback resistor Rf constitutes the negative feedback of the push-pull amplifier. The negative feedback reduced a load resistance of the push-pull amplifier as pre-stage, reduces a load resistance output of current stage simultaneously, expends a working bandwidth output of the high-frequency signal, and makes a gain of an operational amplifier relatively constant in different kinds of technological conditions. In addition, the push-pull amplifier samples a voltage and sums a current by the feedback resistor Rf (that is, to amplify the current), so a structure of the high-frequency bandwidth amplifier circuit is simple, and a power loss is low.

The first active inductor comprises a first resistor R1 and a third FET M3. A drain electrode of the third FET M3 is connected with the external power source VDD. A source electrode of the third FET M3 is connected with the output port OUT. A first end of the first resistor R1 is connected with a gate electrode of the third FET M3. A second end of the first resistor R1 is connected with the drain electrode of the third FET M3. Thus, the first active inductor constitutes an active inductor that is connected between the output port OUT and the external power source VDD. The second active inductor comprises a second resistor R2 and a fourth FET M4. A drain electrode of the fourth FET M4 is connected with the output port OUT. A source electrode of the fourth FET M4 is grounded. A first end of the second resistor R2 is connected with a gate electrode of the fourth FET M4. A second end of the second resistor R2 is connected with the source electrode of the fourth FET M4. In such a manner that the second active inductor constitutes an active inductor that is connected between the output port OUT and a ground. Thus, a cooperation of the first active inductor and the second active inductor is able to provide an extra zero. The transfer function of the high-frequency signal rises by 20 db/10 times' frequency course in the extra zero, which just compensates a pole that is emerged by the parasitic capacitance of the amplifier in the extra zero. The first active inductor and the second active inductor keep a large gain expend a bandwidth simultaneously, and increase a gain bandwidth product. A production of the pole and the extra zero and a specific effect to the high-frequency signal, are all known by people skilled in the art, and will not be described in detail anymore. Because of inherent characteristics of the push-pull amplifier, the output terminal of the push-pull amplifier is a drain terminal (see the FIGURE), which causes an output working point uncertainly. In the present invention, because "output-power source" and "output-ground" appear in pairs, so the output working point of the push-pull amplifier is determined, a floating problem of the output working point of the push-pull amplifier is avoided, and a more balanced output driving is provided. In the practical application of the present invention, a choice of the first active inductor and the second active inductor will be decided under specific parameters of the push-pull amplifier, for offsetting an effect on the bandwidth of the high-frequency signal by the parasitic capacitance of the push-pull amplifier effectively.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:
1. A high-frequency bandwidth amplifier circuit, comprising:
a push-pull amplifier,
a feedback resistor, a first active inductor, and
a second active inductor,
wherein an input terminal of said push-pull amplifier is connected with an external input terminal, an output terminal of said push-pull amplifier is connected with an output port, a first end of said feedback resistor is connected with said external input terminal, a second end of said feedback resistor is connected with said output port, a first end of said first active inductor is connected with an external power source, a second end of said first active inductor is connected with said output port, a first end of said second active inductor is grounded, and a second end of said second active inductor is connected with said output port;
wherein said push-pull amplifier comprises a first FET and a second FET, said external input terminal is connected with a gate electrode of said first FET and a gate electrode of said second FET, a source electrode of said first FET is connected with said external power source, a source electrode of said second FET is grounded, and said output port is connected with a drain electrode of said first FET and a drain electrode of said second FET.

2. The high-frequency bandwidth amplifier circuit, as recited in claim 1, wherein said first active inductor comprises a first resistor and a third FET, a drain electrode of said third FET is connected with said external power source, a source electrode of said third FET is connected with said output port, a first end of said first resistor is connected with a gate electrode of said third FET, and a second end of said first resistor is connected with said drain electrode of said third FET.

3. The high-frequency bandwidth amplifier circuit, as recited in claim 1, wherein said second active inductor comprises a second resistor and a fourth FET, a drain electrode of said fourth FET is connected with said output port, a source electrode of said fourth FET is grounded, a first end of said second resistor is connected with a gate electrode of said fourth FET, and a second end of said second resistor is connected with said source electrode of said fourth FET.

* * * * *